(12) United States Patent
Shirakawa et al.

(10) Patent No.: US 8,377,148 B2
(45) Date of Patent: Feb. 19, 2013

(54) METHOD FOR PRODUCING CAPACITOR, CAPACITOR, WIRING BOARD, ELECTRONIC DEVICE, AND IC CARD

(75) Inventors: Akihiko Shirakawa, Chiba (JP); Koji Tokita, Ichihara (JP); Chunfu Yu, Chiba (JP)

(73) Assignee: Showa Denko K.K., Tokyo (JP)

( * ) Notice: Subject to any disclaimer, the term of this patent is extended or adjusted under 35 U.S.C. 154(b) by 371 days.

(21) Appl. No.: 12/762,071

(22) Filed: Apr. 16, 2010

(65) Prior Publication Data

US 2010/0195293 A1     Aug. 5, 2010

Related U.S. Application Data

(63) Continuation of application No. PCT/JP2008/068647, filed on Oct. 15, 2008.

(30) Foreign Application Priority Data

Oct. 17, 2007   (JP) ................................. 2007-270433

(51) Int. Cl.
*H01G 9/00*   (2006.01)
(52) U.S. Cl. ........................................ 29/25.03
(58) Field of Classification Search .................. None
See application file for complete search history.

(56) References Cited

U.S. PATENT DOCUMENTS

| | | | |
|---|---|---|---|
| 3,126,503 A | | 3/1964 | Salomon |
| 3,599,053 A | | 8/1971 | Iida et al. |
| 2004/0251140 A1 | * | 12/2004 | Chung ............................ 205/50 |
| 2011/0136024 A1 | * | 6/2011 | Seymour ........................ 429/405 |

FOREIGN PATENT DOCUMENTS

| | | |
|---|---|---|
| JP | 33-005816 B1 | 7/1958 |
| JP | 42-024103 B1 | 11/1967 |
| JP | 42-027011 B1 | 12/1967 |
| JP | 43-002649 B1 | 1/1968 |
| JP | 54-001020 B | 1/1979 |
| JP | 05-121275 A | 5/1993 |
| JP | 09-306791 A | 11/1997 |
| JP | 11-080596 A | 3/1999 |
| JP | 2004-018966 A | 1/2004 |

OTHER PUBLICATIONS

T. Shibata, et al., "The Effect of Temperature on the Growth of Anodic Oxide Film on Titanium", Corrosion Science, 1995, pp. 133-144, vol. 37, No. 1.

* cited by examiner

*Primary Examiner* — Seahvosh Nikmanesh
(74) *Attorney, Agent, or Firm* — Sughrue Mion, PLLC (57) ABSTRACT

There is provided a method for producing a capacitor which is capable of producing a capacitor having a high withstand voltage and low leakage current, the method for producing a capacitor which is a method for producing a capacitor having a substrate serving as one electrode, a dielectric layer formed on top of the substrate, and the other electrode formed on top of the dielectric layer, the method including a step for forming an amorphous titanium oxide layer which is to become the dielectric layer on top of the substrate by anodizing the substrate, which is composed of titanium or titanium alloy, in an electrolyte solution containing hydrogen peroxide and having a temperature of 3° C. or less; and a step for forming the other electrode on top of the dielectric layer.

8 Claims, 5 Drawing Sheets

METHOD FOR PRODUCING CAPACITOR, CAPACITOR, WIRING BOARD, ELECTRONIC DEVICE, AND IC CARD

CROSS REFERENCE TO RELATED APPLICATIONS

This application is a Continuation of International Application No. PCT/JP2008/068647 filed Oct. 15, 2008, claiming priority based on Japanese Patent Application No. 2007-270433 filed Oct. 17, 2007, the contents of all of which are incorporated herein by reference in their entirety.

TECHNICAL FIELD

The present invention relates to a method for producing a capacitor, a capacitor, and a wiring board, electronic device and IC card which include the capacitor, and particularly relates to a method for producing a capacitor which is capable of producing a capacitor having a high withstand voltage and low leakage current.

BACKGROUND ART

Aluminum oxide, tantalum oxide and niobium oxide have conventionally been used as dielectric materials of electrolytic capacitors. In addition, studies have long been conducted on capacitors using titanium dioxide, which has a larger relative dielectric constant than the above oxides, for the dielectric material (hereafter, frequently referred to as a "titanium capacitor"). However, due to the problem of large leakage current, these titanium capacitors have yet to be put to practical use. This problem of large leakage current is critical, especially for the metallic electrodes effective in reducing the extent of impedance in the gigahertz region which has been required recently, since restoration (that is, reoxidation) of electrical leakage, which takes place when an electrolyte solution or electrically conductive polymer is used for the cathode in an electrolytic capacitor, cannot be expected.

The following describes previous attempts made to reduce the level of leakage current in titanium capacitors.

For example, in Patent Document 1, although a non-aqueous solvent is subjected to anodic oxidation for use as an electrolyte solution, there is a description stating that "a product chemically converted in a non-aqueous solution instantly deteriorates when transferred to an aqueous solution". Consequently, although not described in Patent Document 1, it is clear that a non-aqueous solvent having low electrical conductivity is used as an electrolyte solution. In addition, possibly due to the use of a non-aqueous solvent as an electrolyte solution, although the leakage current is low, dielectric loss tangent at 10 kHz is 10% or more in all cases.

Further, in Patent Document 2, a method has been shown for obtaining an anodized film having superior electrical properties by using a titanium alloy containing vanadium, chromium and aluminum. However, the dielectric loss tangent thereof is 1.5% or more.

Moreover, in Patent Document 3, there is a description stating that a capacitor obtained by anodic oxidation of titanium has leakage current that is greater than that of tantalum or aluminum by two digits or more. Furthermore, in Patent Document 3, a method has been shown for reducing leakage current by forming a passive layer with a nitric acid solution as a pretreatment of anodic oxidation. However, the dielectric loss tangent of the resulting sample is 1.5% or more.

Also, in Patent Document 4, the same inventor as that of Patent Document 3 has shown that the addition of tungsten or molybdenum to titanium reduces the level of leakage current to about one-half, as compared to the cases where no addition was made. However, even though the leakage current problem is improved by reducing the level thereof down to a degree of ½, this level is still inadequate for practical use.

In addition, Patent Document 5 has shown that leakage current and loss can be reduced by containing barium peroxide or strontium peroxide in a molten salt of sodium nitrite and anodizing at a temperature of 280 to 350° C. However, the dielectric loss tangent at this time is 2.8% or more.

Further, Patent Document 6 has shown that leakage current is reduced by using an alloy containing 20 to 30 atomic % of aluminum in titanium. However, in Patent Document 6, measurement of electrical properties has been carried out in an electrolyte solution. It has generally been known that in electrostatic capacitors, an electrical leakage portion is reanodized and insulated (restoration effects) when a direct current voltage is applied in an electrolyte solution, electrically conductive polymer and the like. Therefore, it is assumed that the level of leakage current was reduced due to the restoration effects in the measurement made in Patent Document 6.

In addition, in Patent Document 7, a method has been shown for obtaining a capacitor having a satisfactory dielectric loss tangent by adjusting the anodic oxidation conditions and carrying out a heat treatment thereafter. In Patent Document 7, there is a description stating that low temperatures are more desirable for anodic oxidation, and a case where an anodic oxidation process was carried out at a temperature of 5° C. is disclosed therein as an example. However, although the electrical properties of capacitors were measured in Patent Document 7 by employing an electrolyte solution having a restoration capacity as a cathode for the capacitors, the dielectric loss tangent thereof exceeded 0.6%.

Further, in Non-Patent Document 1, it has been shown that the dielectric constant of an anodized film of titanium is dependent on the temperature for anodic oxidation. However, the dielectric constant reduced as the temperature decreased, and the relative dielectric constant at 303 K (that is, 30° C.) was 26.2. It is difficult to produce a capacitor having a large capacity with this dielectric constant.

[Patent Document 1] Japanese Examined Patent Application, Second Publication No. Sho 33-5816
[Patent Document 2] U.S. Pat. No. 3,126,503
[Patent Document 3] Japanese Examined Patent Application, Second Publication No. Sho 42-27011
[Patent Document 4] Japanese Examined Patent Application, Second Publication No. Sho 42-24103
[Patent Document 5] Japanese Examined Patent Application, Second Publication No. Sho 43-2649
[Patent Document 6] Japanese Examined Patent Application, Second Publication No. Sho 54-1020
[Patent Document 7] Japanese Unexamined Patent Application, First Publication No. Hei 5-121275
[Non-Patent Document 1] Corrosion Science, Vol. 37, No. 1, pp. 133-144

DISCLOSURE OF INVENTION

Problems to be Solved by the Invention

In order to solve the above-mentioned problems regarding the titanium capacitors, an object of the present invention is to provide a method for producing a capacitor which is capable of producing a capacitor having a high withstand voltage and low leakage current.

Moreover, another object of the present invention is to provide a capacitor having a high withstand voltage and low leakage current. Furthermore, yet another object of the present invention is to provide a wiring board, electronic device and IC card which include the capacitor of the present invention.

Means for Solving the Problems

In order to solve the above-mentioned problems, the present invention provide the following aspects.

(1) A method for producing a capacitor having a substrate serving as one electrode, a dielectric layer formed on top of the substrate, and the other electrode formed on top of the dielectric layer, the method including a step for forming an amorphous titanium oxide layer which is to become the dielectric layer on top of the substrate by anodizing the substrate, which is composed of titanium or titanium alloy, in an electrolyte solution containing hydrogen peroxide and having a temperature of 3° C. or less; and a step for forming the other electrode on top of the dielectric layer.

(2) The method for producing a capacitor according to the above aspect (1), wherein the concentration of the hydrogen peroxide in the electrolyte solution is from at least 0.1% by mass up to less than 50% by mass.

(3) The method for producing a capacitor according to the above aspect (1) or (2), wherein the electrolyte solution is an aqueous phosphoric acid solution.

(4) The method for producing a capacitor according to any one of the above aspects (1) to (3), wherein the titanium alloy is an alloy containing 70% by mass or more of titanium.

(5) The method for producing a capacitor according to any one of the above aspects (1) to (4), wherein the substrate is a foil.

(6) The method for producing a capacitor according to the above aspect (5), wherein the thickness of the foil is within a range from 5 to 300 μm.

(7) The method for producing a capacitor according to any one of the above aspects (1) to (6), wherein the other electrode is composed of a metal.

(8) The method for producing a capacitor according to any one of the above aspects (1) to (7) further including a step for laminating an insulating material layer which is to become a dielectric layer on top of the titanium oxide layer.

(9) A capacitor produced using the method for producing a capacitor described in any one of the above aspects (1) to (8).

(10) A capacitor having a substrate serving as one electrode, a dielectric layer formed on top of the substrate, and the other electrode formed on top of the dielectric layer, the capacitor including the substrate composed of titanium or titanium alloy; and the dielectric layer containing an amorphous titanium oxide layer.

(11) The capacitor according to the above aspect (10), wherein the dielectric layer is a laminated body including the amorphous titanium oxide layer and an insulating material layer.

(12) The capacitor according to any one of the above aspects (9) to (11), wherein the refractive index of the amorphous titanium oxide layer at a wavelength of 632.8 nm is within a range from 1.90 to 2.35.

(13) The capacitor according to any one of the above aspects (9) to (12), wherein the relative dielectric constant of the amorphous titanium oxide layer is within a range from 30 to 50.

(14) The capacitor according to any one of the above aspects (9) to (13), wherein the product of capacitance density and dielectric breakdown voltage at a measuring frequency of 1 kHz is 200 nF·V/cm$^2$ or more.

(15) The capacitor according to any one of the above aspects (9) to (14), wherein the dielectric loss tangent at a measuring frequency of 1 kHz is 0.01 or less.

(16) The capacitor according to any one of the above aspects (9) to (15), wherein the electrostatic capacitance at a measuring frequency of 1 MHz is 80% or more of the electrostatic capacitance at a measuring frequency of 100 Hz.

(17) A wiring board including the capacitor described in any one of the above aspects (9) to (15).

(18) An electronic device including the capacitor described in any one of the above aspects (9) to (15).

(19) An IC card including the capacitor described in any one of the above aspects (9) to (15).

Effect of the Invention

Since the method for producing a capacitor according to the present invention includes a step for forming an amorphous titanium oxide layer, which is to become a dielectric layer, on top of a substrate composed of titanium or an alloy containing titanium by anodizing the substrate in an electrolyte solution containing hydrogen peroxide and having a temperature of 3° C. or less, a capacitor having a high withstand voltage and low leakage current can readily be obtained.

In addition, according to the method for producing a capacitor of the present invention, the thickness of the amorphous titanium oxide layer, which is to become a dielectric layer, can readily be controlled by adjusting the conditions for subjecting the substrate to anodic oxidation.

Accordingly, according to the method for producing a capacitor of the present invention, a capacitor having a high withstand voltage and low leakage current and including a dielectric layer with a desired thickness can be produced at low cost without requiring the use of complex and elaborate equipment.

Furthermore, according to the method for producing a capacitor of the present invention, since a capacitor having a low leakage current can be obtained, there is no need to use an electrolyte solution, electrically conductive polymer or carbon paste and the like which is capable of self-restoration as an electrode, and thus the size of the capacitor can be reduced and the manufacturing process can also be simplified, as compared to the cases where a capacitor having an electrode capable of self-restoration is formed.

DESCRIPTION OF THE REFERENCE SYMBOLS

1: Substrate
2: Dielectric layer
3: Counter electrode (the other electrode)
10: Capacitor

BEST MODE FOR CARRYING OUT THE INVENTION

The present invention will be described below in great detail.

(Capacitor)

Figure 1:
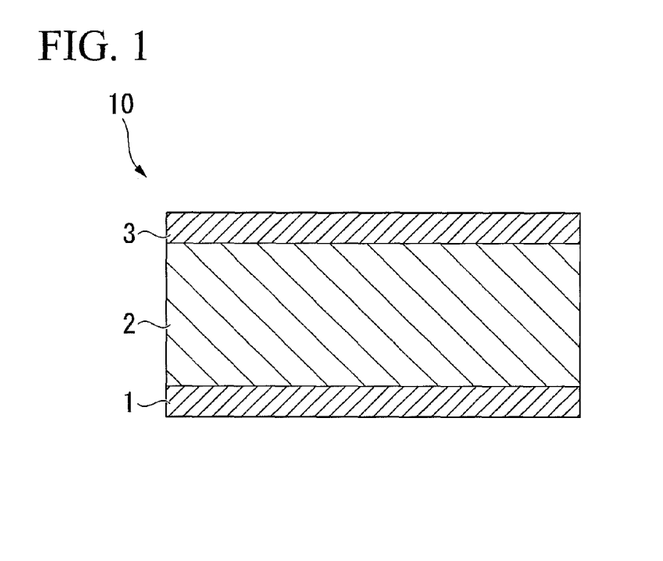
FIG. 1 is a schematic cross sectional view showing an example of a capacitor according to the present invention.

FIG. 1 is a schematic cross sectional view showing an example of a capacitor according to the present invention. A capacitor 10 shown in FIG. 1 includes a substrate 1 which also serves as one electrode, a dielectric layer 2 formed on top of the substrate 1, and a counter electrode (the other electrode) 3 formed on top of the dielectric layer 2. The capacitor 10 of the present invention shown in FIG. 1 is a capacitor produced using a method for producing a capacitor according to the present invention described later.

It is desirable that the thickness of the capacitor 10 be as thin as possible with respect to compact size and increased functional sophistication of the electronic device using the capacitor, and is preferably set to a thickness of 200 μm or less. Further, it is more desirable that the thickness of the capacitor 10 be 100 μm or less since it facilitates formation of a capacitor within a wiring board.

(Substrate)

The substrate 1 is composed of titanium or an alloy containing titanium. The titanium alloy may be any alloy as long as the dielectric layer 2 composed of an amorphous titanium oxide layer can be formed on the surface thereof by an anodic oxidation process described later, and alloys containing 70% by mass or more of titanium are preferably used, and specific examples thereof include 0 titanium (containing 76% by mass of titanium, 15% by mass of V, 3% by mass of Cr, 3% by mass of Sn and 3% by mass of Al).

The shape of the substrate 1 may be any shape as long as it can be used as an electrode of the capacitor 10, and, for example, a plate-shaped substrate, a foil-shaped substrate or the like can be used, although a foil-shaped substrate is particularly preferable.

When the substrate 1 is foil, the capacitor 10 can be easily reduced in both size and weight. In addition, as the surface area of the substrate 1 per unit mass increases, proportion of the substrate 1 with respect to the dielectric layer 2 increases, and thus it is advantageous to attain a capacitor having a high capacity when the substrate 1 is foil.

When the substrate is foil, the thickness of the foil is preferably within a range from 5 to 300 μm, more preferably from 5 to 100 μm and even more preferably 5 to 30 μm. When the foil thickness exceeds the above-mentioned range, the level of the electrostatic capacitance per unit volume of the capacitor 10 reduces. On the other hand, when the foil thickness is less than the above-mentioned range, the foil becomes too thin when an etching is carried out on the substrate 1, which makes it difficult to handle.

Further, as the substrate 1, a substrate having a roughened surface, a substrate having fine pores on the surface and inside thereof, or the like may be used. In this case, it is preferable because the surface area of the substrate 1 per unit mass becomes large, and thus it is advantageous to attain a capacitor having a high capacity.

(Dielectric Layer)

The dielectric layer 2 is composed of an amorphous titanium oxide layer. When the cross section of titanium oxide layer constituting the dielectric layer 2 is observed using a transmission electron microscope (TEM), the layer appears amorphous with hardly any crystallized domains visible within the field of view. In addition, the refractive index of the titanium oxide layer constituting the dielectric layer 2 is within a range from 1.90 to 2.35 at a wavelength of 632.8 nm, a value smaller than 2.56 which is the refractive index of a crystalline titanium dioxide. From these observations, it is apparent that the titanium oxide constituting the dielectric layer 2 is not crystalline but amorphous. Further, the relative dielectric constant of such a titanium oxide layer constituting the dielectric layer 2 is typically within a range from 30 to 50.

It is preferable that the thickness of the dielectric layer 2 be within a range from 1 nm to 300 nm. In terms of the thickness of the dielectric layer 2, although the dielectric breakdown voltage reduces when it is thin, the capacitance of a capacitor increases. For this reason, the thickness of the dielectric layer 2 is appropriately determined depending on the performance required for the capacitor 10, such as the level of withstand voltage and capacitance density of the capacitor 10.

(Counter Electrode)

The counter electrode 3 is preferably composed of a metal formed directly on top of the dielectric layer 2.

By forming the counter electrode 3 composed of a metal directly on top of the dielectric layer 2, it is possible to provide the capacitor 10 with excellent high-frequency properties. Examples of the metal used in the counter electrode 3 include copper, nickel, platinum, palladium and aluminum. Of these metals, it is most preferable to use copper which is easy to handle during a soldering process or the like. The thickness of the counter electrode 3 can be determined depending on the material of the counter electrode 3 with no particular limitations, and the thickness can be adjusted to, for example, about 1 to 40 μm.

It should be noted that since the capacitor 10 of the present embodiment has a low leakage current, it is not necessarily essential to use, as the counter electrode, an electrolyte solution, electrically conductive polymer or the like which is capable of self-restoring the dielectric layer 2.

(Capacitor Characteristics)

In the capacitor 10 of the present embodiment shown in FIG. 1, the product of capacitance density and dielectric breakdown voltage at a measuring frequency of 1 kHz is normally 200 nF×V/cm$^2$ or more (for example, the capacitance density is 100 nF×V/cm$^2$ or more if the dielectric breakdown voltage is 2 V when applying a direct current voltage). Further, in the capacitor 10 of the present embodiment, the dielectric loss tangent (tan δ) at a measuring frequency of 1 kHz is normally 0.01 or less, and the electrostatic capacitance at a measuring frequency of 1 MHz is 80% or more of the electrostatic capacitance at a measuring frequency of 100 Hz.

(Method for Producing a Capacitor)

Next, a detailed explanation is provided of the method for producing the capacitor of the present embodiment using an example.

In order to produce the capacitor 10 of the present embodiment shown in FIG. 1, it is preferable to first remove natural oxide films, stains, scratches or the like from the surface of the substrate 1, by conducting, for example a pretreatment for removing the surface layer of the substrate 1 composed of titanium or a titanium alloy by at least 1 μm through an etching process. As an etching method to be adopted in the pretreatment step, chemical etching using hydrofluoric acid or electrolytic etching and the like can be employed. In addition, in order to obtain the capacitor 10 with a high capacitance, by appropriately selecting the etching conditions in the pretreatment step, the surface area of the substrate 1 may be increased by forming irregularities on the surface thereof.

Next, the substrate 1 (which may be cut out so as to have an adequate size) with which the aforementioned pretreatment step has already been completed is anodized, thereby forming the dielectric layer 2 composed of an amorphous titanium oxide layer on the substrate 1.

When conducting an anodic oxidation on the substrate 1, it is preferable to carry out the process by first coating the substrate 1 with a masking material at a location in which the substrate 1 is brought into contact with an electrolyte solution in order to avoid the adverse effects due to the fluctuations in the liquid level when immersing the substrate 1 in the electrolyte solution. Examples of the masking material include a commonly used heat resistant resin, preferably a heat resistant resin that is either soluble or swellable in a solvent or a derivative thereof, and a composition composed of an inorganic fine powder and cellulose-based resin (for example, refer to Japanese Unexamined Patent Application, First Publication No. Hei 11-80596).

Subsequently, a masking tape is attached onto one surface of the substrate 1 so as not to be subjected to anodic oxidation. Then an anodic oxidation process is carried out by conducting chemical conversion at a predetermined voltage and current density using the substrate 1 as an anode by immersing the substrate 1 in the electrolyte solution while making the other surface thereof, to which the masking tape is not attached, to face the cathode.

(Electrolyte Solution)

The electrolyte solution used for the anodic oxidation of the substrate 1 is an electrolyte solution containing hydrogen peroxide and an electrolyte. The concentration of hydrogen peroxide is preferably maintained from at least 0.1% by mass up to less than 50% by mass, more preferably from 0.1% by mass to 40% by mass, and even more preferably from 0.2% by mass to 20% by mass. When the concentration of hydrogen peroxide either exceeds the above-mentioned range or is less than the above-mentioned range, the dielectric loss tangent (tan δ) of 0.01 or less at a measuring frequency of 1 kHz cannot be achieved at times.

Although the detailed action mechanism of hydrogen peroxide is not clear, it is thought that one or more of the following effects are attained: i.e., an effect to prevent the reprecipitation of titanium compound on the anode due to the formation of peroxo complex with titanium ions; an effect as a depolarizer to prevent the hydrogen gas which is said to be partially generated also on the anode from forming air bubbles and adversely affecting the anodic oxidation of the substrate 1; and an effect as an oxidizing agent to assist the anodic oxidation of the substrate 1.

Examples of the electrolyte contained in the electrolyte solution include an acid and/or a salt thereof. More specific examples of the electrolyte include phosphoric acid, sulfuric acid, oxalic acid, boric acid and adipic acid as well as salts thereof. It is particularly preferable when an aqueous phosphoric acid solution containing, as an electrolyte, at least one material selected from phosphoric acid and a salt thereof is used as an electrolyte solution, since the level of the resistance of titanium oxide layer obtained by the anodic oxidation is further increased. It is assumed that the reason for the above observation is due to the prevention of crystallization of an anodized film by the phosphorus incorporated within the anodized film during the anodic oxidation of the substrate 1. In addition, it is preferable to use an inorganic compound, such as phosphoric acid, which is hardly oxidized as an electrolyte because the concentration of hydrogen peroxide within the electrolyte solution reduces only gradually.

Further, an antifreezing agent may be contained in the electrolyte solution. The amount of antifreezing agent added is preferably as small as possible so that the electrolyte solution is not frozen during the anodic oxidation. Examples of the antifreezing agent include ethylene glycol, isopropanol, ethanol and diethylene glycol.

(Electrolyte Solution Temperature)

The temperature of the electrolyte solution during anodic oxidation is adjusted to 3° C. or less, and is preferably adjusted to 0° C. or less. When the temperature of the electrolyte solution exceeds 3° C., the crystallization of the titanium oxide layer readily occurs. More specifically, when the temperature of the electrolyte solution exceeds 3° C., the refractive index of the titanium oxide layer obtained by anodic oxidation may exceed 2.35. By adjusting the temperature of the electrolyte solution to 3° C. or less, an amorphous titanium oxide layer can be stably formed. In addition, when the temperature of the electrolyte solution exceeds 0° C., air bubbles begin to form on the substrate 1, possibly due to the degradation of the electrolyte solution, and the current not associated with the formation of the titanium oxide layer is observed. For this reason, it is more preferable to adjust the temperature of the electrolyte solution to 0° C. or less. Furthermore, when the temperature of the electrolyte solution is adjusted to −10° C. or less, the properties of the titanium oxide layer obtained by anodic oxidation no longer exhibit great differences even if the temperature of the electrolyte solution is changed. However, when the temperature of the electrolyte solution is adjusted to a low temperature of −30° C. or less, the amount of antifreezing agent such as ethylene glycol added in order to prevent the freezing of electrolyte solution becomes too large. Hence, the level of the resistance of electrolyte solution increases when the temperature of the electrolyte solution is adjusted to −30° C. or less, thereby limiting the current density at the time of conducting anodic oxidation to a low level. Therefore, it is preferable that the temperature of the electrolyte solution be not less than −30° C.

The anodic oxidation process in the present embodiment is conducted using the above-mentioned electrolyte solution at the above-mentioned electrolyte solution temperature, and carrying out constant-current anodic oxidation using the substrate as an anode under the conditions of, for example, a current density of 0.1 to 1,000 mA/cm$^2$, a voltage of 2 to 400 V and a duration of 1 msec to 400 min, and then carrying out constant-current anodic oxidation after having reached a specified voltage. It should be noted that it is more preferable to conduct the anodic oxidation under the conditions consisted of a current density of 0.1 to 100 mA/cm$^2$, a voltage of 5 to 90 V and a duration of 1 sec to 300 min.

Note that there is a correlation between the thickness of the titanium oxide layer obtained as a result of anodic oxidation and the above-mentioned conditions for the anodic oxidation process, such as the material used for the substrate 1 and the voltage applied during the anodic oxidation. Therefore, by adjusting the above-mentioned conditions for the anodic oxidation, it is possible to appropriately adjust the thickness of the titanium oxide layer.

The substrate 1 on which the formation of the dielectric layer 2 composed of an amorphous titanium oxide layer by anodic oxidation has been completed is dried, following the removal of electrolyte solution by washing. Thereafter, the masking tape is peeled off, and the counter electrode 3 is formed on top of the dielectric layer 2. The counter electrode 3 can be obtained by depositing a film made of metal such as copper with a vacuum deposition method or the like. By forming the counter electrode 3 in such a manner, the capacitor 10 shown in FIG. 1 can be obtained.

Since the method for producing the capacitor 10 of the present embodiment includes a step for forming an amorphous titanium oxide layer, which is to become the dielectric layer 2, on top of the substrate 1 composed of titanium or an alloy containing titanium by anodizing the substrate 1 in an electrolyte solution containing hydrogen peroxide and having a temperature of 3° C. or less, the capacitor 10 having a high withstand voltage and low leakage current can readily be obtained.

In addition, when the concentration of hydrogen peroxide in the electrolyte solution is maintained from at least 0.1% by mass up to less than 50% by mass in the method for producing the capacitor 10 of the present embodiment, the effects due to the inclusion of hydrogen peroxide in the electrolyte solution can effectively be achieved.

Further, when the substrate 1 is composed of a titanium alloy in the method for producing the capacitor 10 of the present embodiment, if the titanium alloy is an alloy containing 70% by mass or more of titanium, the dielectric layer 2 composed of an amorphous titanium oxide layer can be readily formed on the surface of the substrate 1.

Moreover, the capacitor 10 of the present embodiment is a capacitor produced by the aforementioned method for producing the capacitor 10 according to the present embodiment, and also includes the substrate 1 serving as one electrode, the dielectric layer 2 formed on top the substrate 1, and the counter electrode formed on top of the dielectric layer 2, wherein the dielectric layer 2 is composed of an amorphous titanium oxide layer. Therefore, the capacitor 10 exhibits a high withstand voltage and low leakage current.

Furthermore, by making the titanium oxide layer constituting the dielectric layer 2 so as to have a large relative dielectric constant within a range from 30 to 50, the capacitor 10 can be configured so as to have a high capacitance density.

In addition, according to the method for producing the capacitor 10 of the present embodiment, the capacitor 10 of high quality in which the product of capacitance density and dielectric breakdown voltage at a measuring frequency of 1 kHz is 200 nF·V/cm$^2$ or more can be readily obtained.

Further, according to the method for producing the capacitor 10 of the present embodiment, the capacitor 10 of high quality in which the dielectric loss tangent (tan δ) at a measuring frequency of 1 kHz is 0.01 or less can be readily obtained.

Moreover, according to the method for producing the capacitor 10 of the present embodiment, the capacitor 10 in which the electrostatic capacitance at a measuring frequency of 1 MHz is 80% or more of the electrostatic capacitance at a measuring frequency of 100 Hz can be readily obtained. Furthermore, since the capacitor 10 of the present embodiment is a capacitor exhibiting a low degree of frequency dependency in which the electrostatic capacitance at a measuring frequency of 1 MHz is 80% or more of the electrostatic capacitance at a measuring frequency of 100 Hz, it can suitably be used for electronic devices such as a wiring board and a high frequency module.

Additionally, according to the method for producing the capacitor 10 of the present embodiment, the dielectric layer 2 that is satisfactorily thin can be formed. Due to the above configuration, various effects can be achieved, for example, the capacitor 10 can be made to have a high electrostatic capacitance, the size of the capacitor 10 can be reduced, and the capacitor 10 can be readily formed within a wiring board or the like.

(Other Examples)

Note that the present invention is not limited to the embodiments described above.

For example, although the capacitor 10 shown in FIG. 1 is configured so that the dielectric layer 2 is composed of an amorphous titanium oxide layer, the dielectric layer may be any dielectric layer as long as it includes an amorphous titanium oxide layer, and may also be a laminated body in which an amorphous titanium oxide layer and an insulating material layer are laminated.

As such a laminated body, for example, it can be configured so that a layer composed of an insulating material, such as a composite oxide layer that includes perovskite crystals in the form of barium titanate or the like, is further laminated on top of a titanium oxide layer. Examples of the method for forming such a composite oxide layer on top of a titanium oxide layer include a method in which an aqueous solution containing at least one type of metal ion selected from the group consisting of Ca, Sr and Ba is reacted with the titanium oxide layer within a temperature range from 80° C. to the boiling point of the aqueous solution. By configuring the dielectric layer constituting a capacitor as such a laminated body, a capacitor having an even higher withstand voltage with an even lower leakage current can be obtained.

Figure 2:
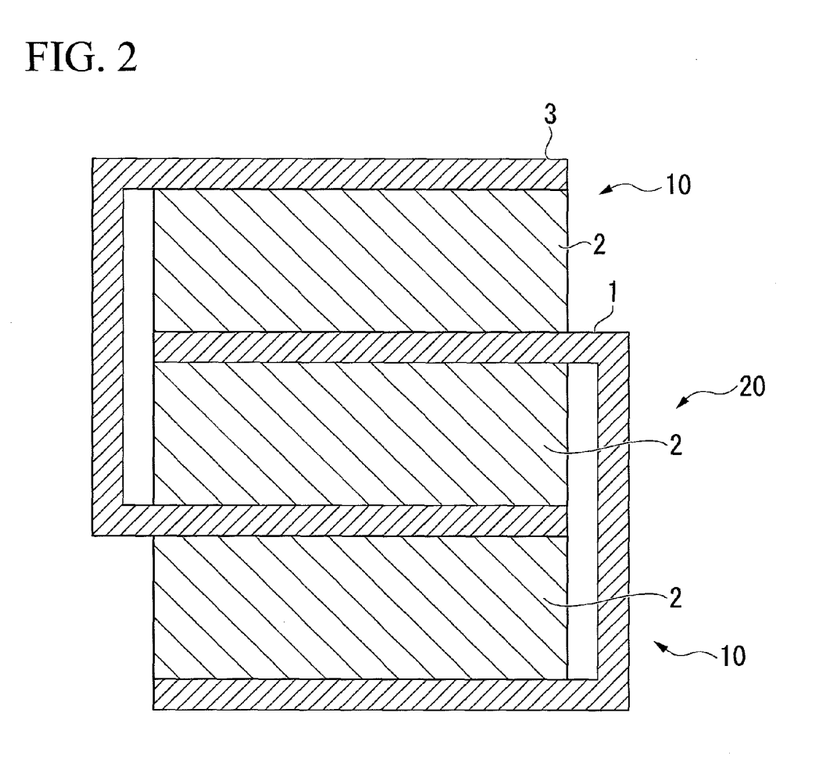
FIG. 2 is a schematic cross sectional view showing another example of a capacitor according to the present invention.

FIG. 2 is a schematic cross sectional view showing another example of a capacitor according to the present invention. A capacitor 20 shown in FIG. 2 is a capacitor having a larger capacitance by laminating the capacitor 10 shown in FIG. 1 in parallel.

Figure 3:
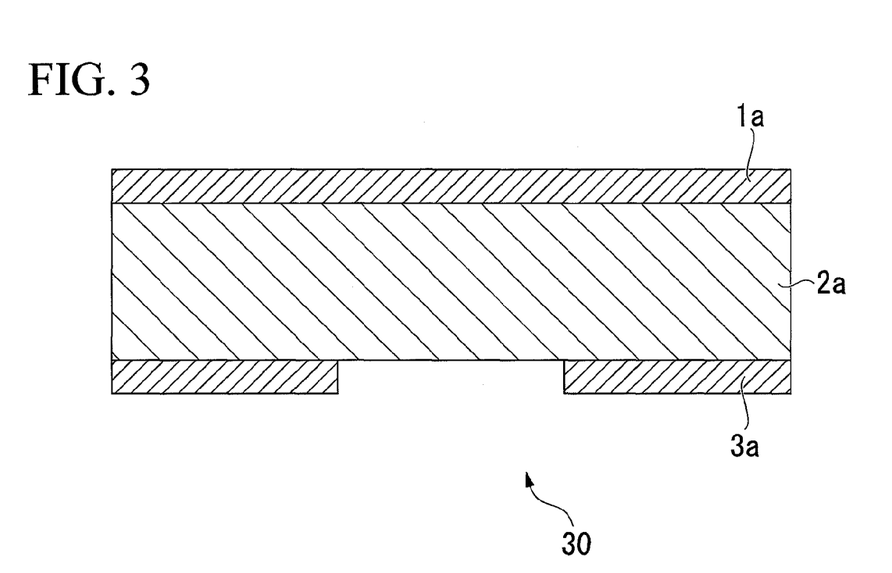
FIG. 3 is a schematic cross sectional view showing yet another example of a capacitor according to the present invention.

Further, FIG. 3 is a schematic cross sectional view showing yet another example of a capacitor according to the present invention. A capacitor 30 shown in FIG. 3 includes, just the same as the capacitor 10 shown in FIG. 1, a substrate 1a that also serves as one electrode, a dielectric layer 2a formed on top of the substrate 1a and a counter electrode 3a (the other electrode) formed on top of the dielectric layer 2a. As shown in FIG. 3, the capacitor 30 can be formed in series by making one electrode as a common electrode and splitting the other electrode.

(Field of Application)

The capacitor of the present invention can be suitably used in wiring boards and electronic devices, and is particularly suited as a component for portable electronic equipment represented by IC cards and mobile phones. Note that the process itself for implementing the capacitor in a wiring board or electronic device can be carried out using ordinary methods.

Since the capacitor of the present invention can be made thin, it can be suitably used as an electronic component, such as a capacitor within a board, and enables the reduction of electronic components in size as well as the reduction of electronic devices containing these electronic components in both size and weight.

EXAMPLES

Although the present invention will be described below in more detail using a series of Examples and Comparative Examples, the present invention is in no way limited to these Examples alone.

Example 1

A rectangle foil made of pure titanium having a thickness of 50 μm (manufactured by Thank Metal Co., Ltd.) was etched with hydrofluoric acid to a thickness of 40 μm for use as a substrate having a titanium content shown in Table 1.

Next, a masking tape (ELEP Masking N380: manufactured by Nitto Denko Corporation) was attached onto one side of the substrate with which a pretreatment step had already been completed. Subsequently, an electrode terminal for anodic oxidation was fixed to one side of the substrate.

Thereafter, an anodic oxidation treatment was carried out on a 10 cm$^2$-sized portion of the substrate ranging from the edge of the side which was opposite to the fixed side of the substrate, in an electrolyte solution having a temperature (° C.) and composition indicated in Table 1, at a current density (mA/cm$^2$) indicated in Table 1, and with a constant current until the anodic oxidation voltage (V) indicated in Table 1 was achieved. Furthermore, after the anodic oxidation voltage (V)

indicated in Table 1 was achieved, an anodic oxidation treatment was carried out at a constant voltage until the duration of 10 minutes had passed from the start of the anodic oxidation process, thereby forming a titanium oxide layer.

(Film Thickness of Titanium Oxide Layer)

In addition, the substrate on which a titanium oxide layer was formed was cut out with a focused ion beam (FIB) device and the resulting cross-sectional structure of the substrate was

TABLE 1

|  | Ti content in substrate (%) | Composition of electrolyte solution | Temperature of electrolyte solution (° C.) | Current density (mA/cm$^2$) | Anodic oxidation voltage |
|---|---|---|---|---|---|
| Ex. 1 | 99.5 | Water:Ethylene glycol:Phosphoric acid:Hydrogen peroxide = 72:24:3:1 | −10 | 1 | 60 |
| Ex. 2 | 99.5 | Water:Ethylene glycol:Phosphoric acid:Hydrogen peroxide = 72:24:3:1 | 0 | 1 | 60 |
| Ex. 3 | 99.5 | Water:Ethylene glycol:Phosphoric acid:Hydrogen peroxide = 72:24:3:1 | 3 | 1 | 60 |
| Ex. 4 | 99.5 | Water:Ethylene glycol:Phosphoric acid:Hydrogen peroxide = 72:24:3:1 | −30 | 1 | 60 |
| Comp. Ex. 1 | 99.5 | Water:Ethylene glycol:Phosphoric acid:Hydrogen peroxide = 72:24:3:1 | 5 | 1 | 60 |
| Comp. Ex. 2 | 99.5 | Water:Ethylene glycol:Phosphoric acid:Hydrogen peroxide = 72:24:3:1 | 10 | 1 | 60 |
| Comp. Ex. 3 | 99.5 | Water:Ethylene glycol:Phosphoric acid:Hydrogen peroxide = 72:24:3:1 | 25 | 1 | 60 |
| Comp. Ex. 4 | 99.5 | Water:Ethylene glycol:Phosphoric acid:Hydrogen peroxide = 72:24:3:1 | 60 | 1 | 60 |
| Ex. 5 | 99.5 | Water:Ethylene glycol:Phosphoric acid:Hydrogen peroxide = 72.8:24:3:0.2 | −10 | 1 | 60 |
| Ex. 6 | 99.5 | Water:Ethylene glycol:Phosphoric acid:Hydrogen peroxide = 72.9:24:3:0.1 | −10 | 1 | 60 |
| Ex. 7 | 99.5 | Water:Ethylene glycol:Phosphoric acid:Hydrogen peroxide = 53:24:3:20 | −10 | 1 | 60 |
| Ex. 8 | 99.5 | Water:Ethylene glycol:Phosphoric acid:Hydrogen peroxide = 33:24:3:40 | −10 | 1 | 60 |
| Ex. 19 | 99.5 | Water:Ethylene glycol:Phosphoric acid:Hydrogen peroxide = 72.95:24:3:0.05 | −10 | 1 | 60 |
| Ex. 20 | 99.5 | Water:Ethylene glycol:Phosphoric acid:Hydrogen peroxide = 40:7:3:50 | −10 | 1 | 60 |
| Ex. 9 | 76 | Water:Ethylene glycol:Phosphoric acid:Hydrogen peroxide = 72:24:3:1 | −10 | 1 | 60 |
| Ex. 10 | 99.5 | Water:Ethylene glycol:Phosphoric acid:Hydrogen peroxide = 72:24:3:1 | −10 | 1 | 5 |
| Ex. 11 | 99.5 | Water:Ethylene glycol:Phosphoric acid:Hydrogen peroxide = 72:24:3:1 | −10 | 1 | 2 |
| Ex. 12 | 99.5 | Water:Ethylene glycol:Phosphoric acid:Hydrogen peroxide = 72:24:3:1 | −10 | 1 | 1 |
| Ex. 13 | 99.5 | Water:Ethylene glycol:Phosphoric acid:Hydrogen peroxide = 72:24:3:1 | −10 | 1 | 90 |
| Ex. 14 | 99.5 | Water:Ethylene glycol:Ammonium adipate:Hydrogen peroxide = 72:24:3:1 | −10 | 1 | 60 |
| Ex. 15 | 99.5 | Water:Ethylene glycol:Sulfuric acid:Hydrogen peroxide = 72:24:3:1 | −10 | 1 | 60 |
| Ex. 16 | 99.5 | Water:Ethylene glycol:Phosphoric acid:Hydrogen peroxide = 72:24:3:1 | −10 | 0.1 | 60 |
| Ex. 17 | 99.5 | Water:Ethylene glycol:Phosphoric acid:Hydrogen peroxide = 72:24:3:1 | −10 | 100 | 60 |
| Ex. 18 | 99.5 | Water:Ethylene glycol:Phosphoric acid:Hydrogen peroxide = 72:24:3:1 | −10 | 300 | 60 |
| Comp. Ex. 5 | 0 |  |  |  |  |

The descriptions on the compositional ratio regarding the composition of electrolyte solution shown in Table 1 indicate the mass ratio of each compound.

Next, the substrate on which a titanium oxide layer was formed was rinsed with water and then dried.

Figure 4:
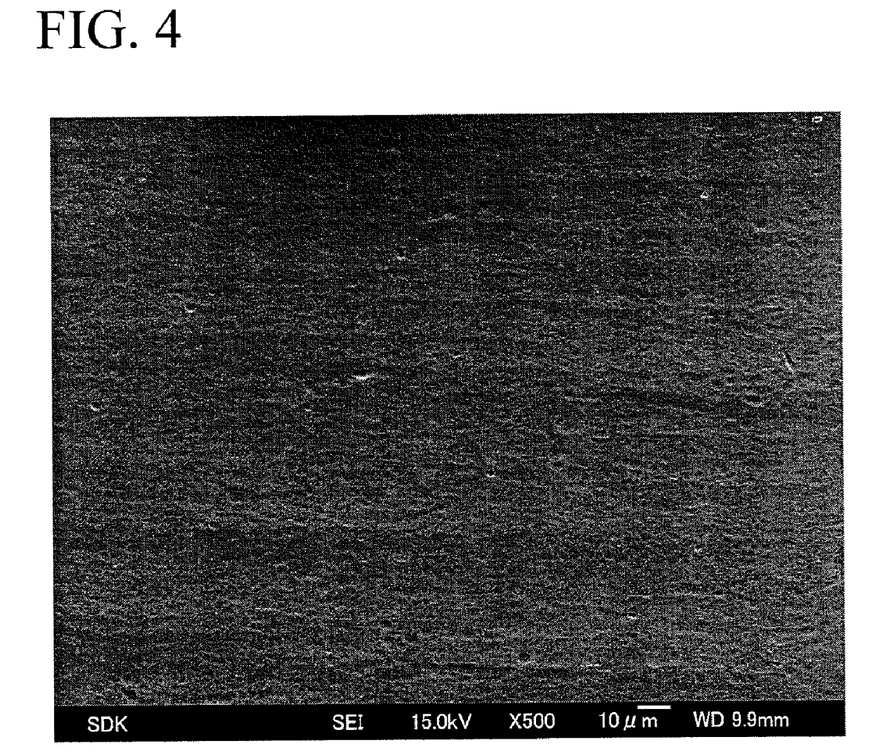
FIG. 4 is an SEM micrograph of the surface of a titanium oxide layer.
Figure 5:
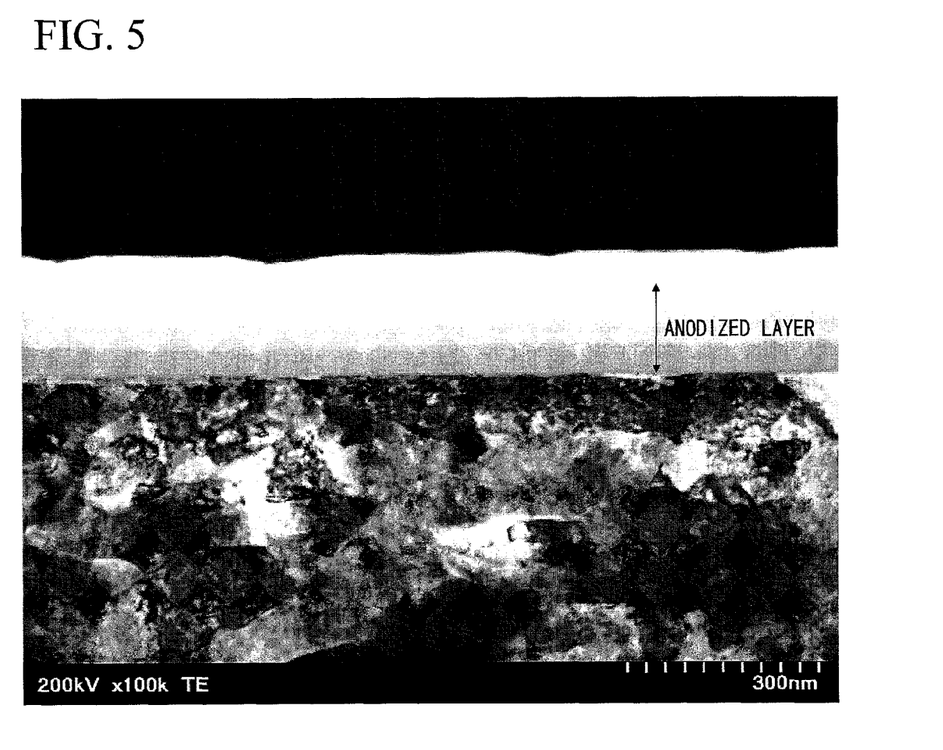
FIG. 5 is a TEM micrograph of a cross section of a titanium oxide layer.

The surface of the obtained titanium oxide layer was then observed with a scanning electron microscope (SEM). The results are shown in FIG. 4. FIG. 4 is an SEM micrograph of the surface of a titanium oxide layer. As shown in FIG. 4, the surface of the titanium oxide layer obtained in Example 1 was smooth.

observed with a transmission electron microscope (TEM), thereby measuring the thickness of the titanium oxide layer. The results are shown in FIG. 5. FIG. 5 is a TEM micrograph of a cross section of a titanium oxide layer.

The film thickness of the titanium oxide layer (anodized layer) obtained in Example 1 shown in FIG. 5 is shown in Table 2.

Further, as shown in FIG. 5, it was confirmed that the titanium oxide layer obtained in Example 1 was amorphous with no visible crystallized domains.

TABLE 2

|  | Film thickness (nm) | Refractive index | Capacitance density (nF/cm$^2$) A | Relative dielectric constant | Dielectric loss tangent | Direct current resistance (Ω) | Dielectric breakdown voltage | A × B (nF · V/cm$^2$) | (C (1 MHz)/ C (100 Hz)) (%) |
|---|---|---|---|---|---|---|---|---|---|
| Ex. 1 | 140 | 2.20 | 206 | 32.6 | 0.002 | $1.4 \times 10^9$ | 4.0 | 824 | 98 |
| Ex. 2 | 140 | 2.28 | 216 | 34.2 | 0.003 | $1.2 \times 10^9$ | 3.6 | 778 | 97 |
| Ex. 3 | 140 | 2.34 | 217 | 34.3 | 0.005 | $1.1 \times 10^9$ | 3.4 | 738 | 95 |
| Ex. 4 | 140 | 2.07 | 204 | 32.3 | 0.002 | $1.5 \times 10^9$ | 4.1 | 836 | 98 |
| Comp. Ex. 1 | 140 | 2.37 | 220 | 34.8 | 0.006 | $8.0 \times 10^8$ | 3.2 | 704 | 91 |
| Comp. Ex. 2 | 140 | 2.46 | 228 | 36.1 | 0.011 | $4.2 \times 10^8$ | 2.9 | 661 | 90 |
| Comp. Ex. 3 | 140 | 2.52 | 240 | 38.0 | 0.045 | $8.6 \times 10^7$ | 2.0 | 480 | 88 |
| Comp. Ex. 4 | 140 | 2.55 | 357 | 56.5 | 0.088 | $2.2 \times 10^6$ | 0.9 | 321 | 69 |
| Ex. 5 | 140 | 2.21 | 204 | 32.3 | 0.002 | $1.4 \times 10^9$ | 4.1 | 836 | 98 |
| Ex. 6 | 140 | 2.20 | 207 | 32.8 | 0.003 | $9.0 \times 10^8$ | 4.0 | 828 | 97 |
| Ex. 7 | 140 | 2.22 | 209 | 33.1 | 0.003 | $1.1 \times 10^9$ | 4.1 | 857 | 97 |
| Ex. 8 | 140 | 2.20 | 211 | 33.4 | 0.003 | $1.1 \times 10^9$ | 3.8 | 802 | 96 |
| Ex. 19 | 140 | 2.21 | 226 | 35.8 | 0.012 | $5.0 \times 10^8$ | 2.2 | 497 | 90 |
| Ex. 20 | 140 | 2.17 | 215 | 34.0 | 0.020 | $2.4 \times 10^8$ | 1.4 | 301 | 87 |
| Ex. 9 | 140 | 2.10 | 316 | 50.0 | 0.009 | $4.3 \times 10^8$ | 1.3 | 411 | 85 |
| Ex. 10 | 12 | 2.02 | 2,400 | 32.6 | 0.004 | $1.2 \times 10^8$ | 0.3 | 720 | 95 |
| Ex. 11 | 4.4 | 1.94 | 6,710 | 33.4 | 0.006 | $2.4 \times 10^7$ | 0.2 | 1,340 | 95 |
| Ex. 12 | 2 | 1.91 | 16,800 | 38.0 | 0.009 | $9.8 \times 10^6$ | 0.1 | 1,680 | 92 |
| Ex. 13 | 210 | 2.20 | 132 | 31.3 | 0.002 | $2.3 \times 10^9$ | 6.2 | 818 | 98 |
| Ex. 14 | 140 | 2.15 | 211 | 33.4 | 0.008 | $7.9 \times 10^8$ | 3.0 | 633 | 88 |

TABLE 2-continued

| | Film thickness (nm) | Refractive index | Capacitance density (nF/cm$^2$) A | Relative dielectric constant | Dielectric loss tangent | Direct current resistance (Ω) | Dielectric breakdown voltage | A × B (nF · V/cm$^2$) | (C (1 MHz)/ C (100 Hz) (%) |
|---|---|---|---|---|---|---|---|---|---|
| Ex. 15 | 140 | 2.24 | 203 | 32.1 | 0.005 | $1.1 \times 10^9$ | 3.8 | 771 | 97 |
| Ex. 16 | 140 | 2.11 | 200 | 31.7 | 0.003 | $1.3 \times 10^9$ | 4.4 | 880 | 98 |
| Ex. 17 | 140 | 2.26 | 213 | 33.7 | 0.005 | $8.8 \times 10^8$ | 3.5 | 746 | 94 |
| Ex. 18 | 140 | 2.30 | 216 | 34.2 | 0.007 | $6.3 \times 10^8$ | 3.1 | 670 | 91 |
| Comp. Ex. 5 | 140 | 2.56 | 518 | 82.0 | 0.125 | $4.7 \times 10^5$ | 0.3 | 155 | 66 |

Figure 6:
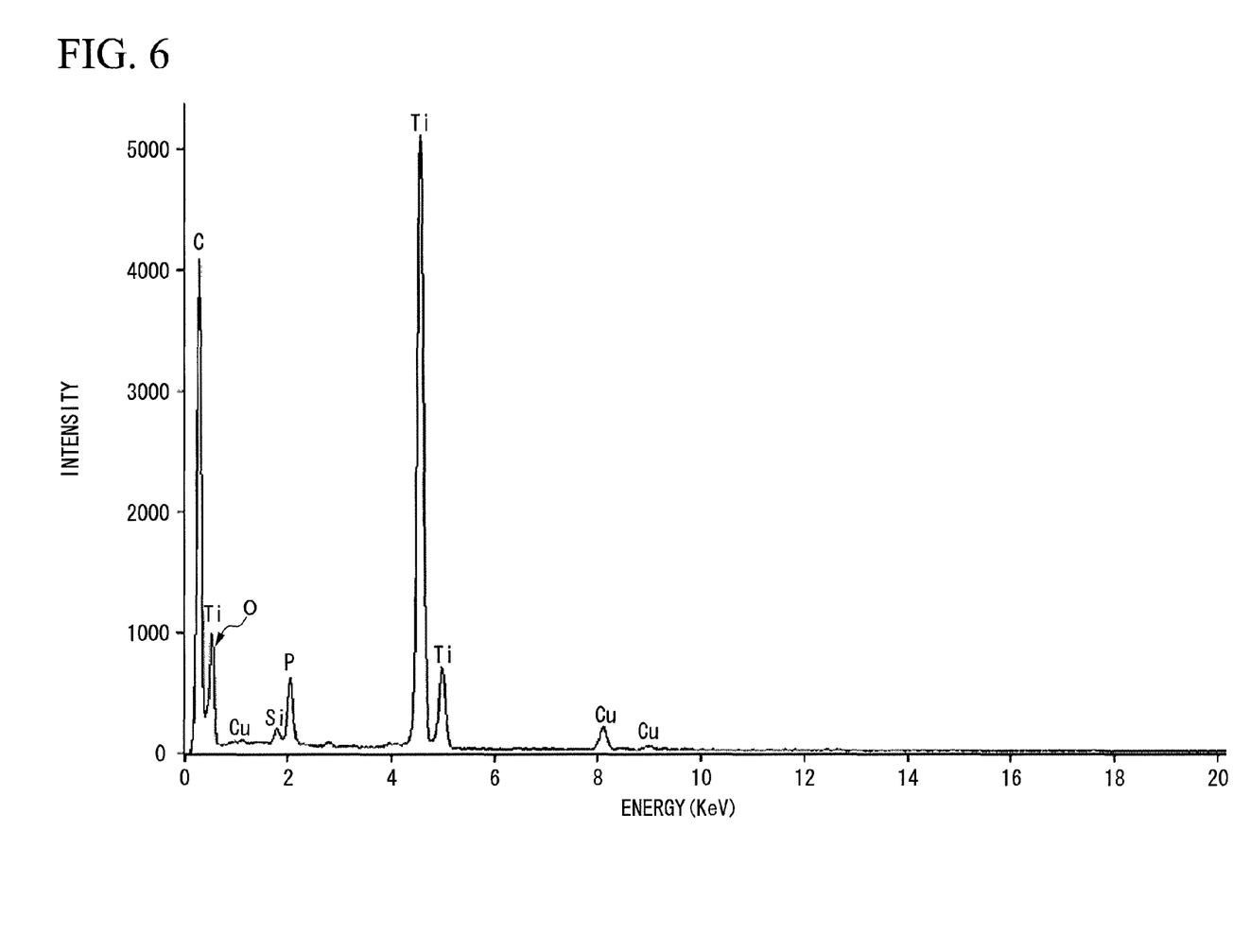
FIG. 6 is a graph showing the result of energy dispersive X-ray spectroscopy (EDS) of a titanium oxide layer.

In addition, the elements which constituted the titanium oxide layer formed on top of the substrate were examined using an energy dispersive X-ray spectrometer (EDS) attached to the TEM. The results are shown in FIG. 6. FIG. 6 is a graph showing the result of energy dispersive X-ray spectroscopy (EDS) of a titanium oxide layer. In FIG. 6, the horizontal axis indicates energy while the vertical axis indicates intensity (counts). From the results shown in FIG. 6, it was possible to verify that the titanium oxide layer obtained in Example 1 contained titanium and oxygen as major components, and a small amount of phosphorus was incorporated within the titanium oxide layer.

(Refractive Index)

In addition, the refractive index of the titanium oxide layer formed on top of the substrate at a wavelength of 632.8 nm was measured using a DHA-XA type ellipsometer (product name, manufactured by Mizojiri Optical Co., Ltd.). As a result, as shown in Table 2, the refractive index of the titanium oxide layer was 2.20.

(Density)

Further, the density of the titanium oxide layer obtained in Example 1 was calculated from the Lorentz-Lorentz equation using 3.9 g/cm$^3$ and 2.56, which were the density and refractive index of anatase (crystalline titanium oxide) generally obtained when anodizing titanium at a voltage of 100 V or less, respectively. As a result, the density of the titanium oxide layer obtained in Example 1 was equivalent to 3.4 g/cm$^3$.

Next, the masking tape was peeled off from the substrate, and a sample was cut out to a size of 30 mm×30 mm. A mask having an opening was then formed in the surface of the sample where the titanium oxide layer was formed. Thereafter, copper was laminated inside the opening to a thickness of 400 nm by an electron beam deposition method to form a counter electrode having a size of 10 mm×10 mm, thereby obtaining a capacitor in which the counter electrode was serving as a cathode while the substrate was serving as an anode. The thickness of the resulting capacitor as a whole of Example 1 obtained in such a manner was 41 µm.

(Capacitance Density)

The electrostatic capacitance of the capacitor obtained in Example 1 was measured using the LF Impedance Analyzer (Model 4192A, Agilent Technologies Inc.) under the conditions of a measuring frequency of 1 kHz and an amplitude of 1 V. As a result, a large value of 206 nF was obtained for the electrostatic capacitance of the capacitor of Example 1. Here, since the electrode area is 1 cm$^2$, the capacitance density of the capacitor obtained in Example 1 becomes 206 nF/cm$^2$ as indicated in Table 2.

(Relative Dielectric Constant)

In addition, the relative dielectric constant of the titanium oxide layer constituting the capacitor obtained in Example 1 was calculated from the electrostatic capacitance and the thickness of the titanium oxide layer.

(Dielectric Loss Tangent (tan δ))

Further, the dielectric loss tangent (tan δ) of the capacitor obtained in Example 1 at a measuring frequency of 1 kHz was determined.

(Direct Current Resistance)

Moreover, the capacitor obtained in Example 1 was connected in series with a 1 MΩ resistor, and a direct current voltage of 1 V was then applied to the capacitor and the 1 MΩ resistor and the voltage applied to both ends of the 1 MΩ resistor was measured 30 seconds after applying the voltage. The direct current resistance of the capacitor was calculated from the voltage value obtained above.

(Dielectric Breakdown Voltage)

Furthermore, the dielectric breakdown voltage (withstand voltage) of the capacitor obtained in Example 1 was determined by the method shown below. First, a direct current applied voltage was increased in 0.1 V increments starting at 1 V using the same measuring circuit as that used during the measurement of direct current resistance described above. After applying each voltage for 30 seconds, the applied voltage was returned to 1 V and the direct current resistance was measured 30 seconds later. The applied voltage when the direct current resistance 30 seconds later had reduced to less than 1 MΩ was taken to be the dielectric breakdown voltage.

(C(1 MHz)/C(100 Hz))

The capacitor obtained in Example 1 was laminated between two flexible copper-clad laminates having a size of 100 mm×100 mm. The electrostatic capacitance was measured using the LF Impedance Analyzer (Model 4192A, Agilent Technologies Inc.) at room temperature at a measuring frequency of 100 Hz, 1 kHz and 1 MHz. As a result, the electrostatic capacitance of the capacitor obtained in Example 1 was 208 nF at a measuring frequency of 100 Hz, 207 nF at 1 kHz, and 204 nF at 1 MHz.

In addition, by using the capacitor obtained in Example 1 laminated between two flexible copper-clad laminates having a size of 100 mm×100 mm, the electrostatic capacitance was measured while continuously changing the temperature from −55° C. to +125° C. at a measuring frequency of 1 kHz using the same LF Impedance Analyzer as described above. The electrostatic capacitance within this temperature range at 1 kHz was a minimum of 204 nF and a maximum of 209 nF. From the result, it became clear that the dependency of electrostatic capacitance on temperature was extremely low.

Further, by using the capacitor obtained in Example 1 laminated between two flexible copper-clad laminates having a size of 100 mm×100 mm, the electrostatic capacitance was measured, while applying a direct current bias voltage of 1.5 V via the flexible copper-clad laminates so that the substrate of the capacitor was at a positive electric potential, at a measuring frequency of 1 kHz using the same LF Impedance Analyzer as described above.

As a result, the electrostatic capacitance of the capacitor obtained in Example 1 was 204 nF. From the result, it became clear that the dependency of electrostatic capacitance on bias voltage was extremely low.

The relative dielectric constant, dielectric loss tangent (tan δ), direct current resistance, dielectric breakdown voltage, the product of capacitance density and dielectric breakdown voltage at a measuring frequency of 1 kHz, and the ratio between the electrostatic capacitance at a measuring frequency of 1 MHz and the electrostatic capacitance at a measuring frequency of 100 Hz (i.e., C(1 MHz)/C (100 Hz)), with respect to the titanium oxide layer of the capacitor of Example 1 obtained in the above-mentioned manner are shown in Table 2.

Examples 2 to 4, Comparative Examples 1 to 4

A titanium oxide layer was formed in the same manner as in Example 1 with the exception that the temperature of the electrolyte solution was changed to a temperature indicated in Table 1. The film thickness and refractive index of the titanium oxide layer were determined in the same manner as in Example 1. The results are shown in Table 2. In addition, a capacitor was formed in the same manner as in Example 1 using a substrate on which a titanium oxide layer had been formed, and the capacitor characteristics indicated in Table 2 were examined in the same manner as in Example 1. The results are shown in Table 2.

Examples 5 to 8, 19 and 20

A titanium oxide layer was formed in the same manner as in Example 1 with the exception that the composition of the electrolyte solution was changed to a composition indicated in Table 1. The film thickness and refractive index of the titanium oxide layer were determined in the same manner as in Example 1. The results are shown in Table 2. In addition, a capacitor was formed in the same manner as in Example 1 using a substrate on which a titanium oxide layer had been formed, and the capacitor characteristics indicated in Table 2 were examined in the same manner as in Example 1. The results are shown in Table 2.

Example 9

A titanium oxide layer was formed in the same manner as in Example 1 with the exception that a foil composed of the AMS 4914 material (having a composition of titanium (76%), V (15%), Cr (3%), Sn (3%) and Al (3%)) with a thickness of 50 μm was used as a substrate. The film thickness and refractive index of the titanium oxide layer were determined in the same manner as in Example 1. The results are shown in Table 2. In addition, a capacitor was formed in the same manner as in Example 1 using a substrate on which a titanium oxide layer had been formed, and the capacitor characteristics indicated in Table 2 were examined in the same manner as in Example 1. The results are shown in Table 2.

Examples 10 to 13

A titanium oxide layer was formed in the same manner as in Example 1 with the exception that the anodic oxidation voltage was changed to a voltage indicated in Table 1. The film thickness and refractive index of the titanium oxide layer were determined in the same manner as in Example 1. The results are shown in Table 2. In addition, a capacitor was formed in the same manner as in Example 1 using a substrate on which a titanium oxide layer had been formed, and the capacitor characteristics indicated in Table 2 were examined in the same manner as in Example 1. The results are shown in Table 2.

Example 14

A titanium oxide layer was formed in the same manner as in Example 1 with the exception that, instead of phosphoric acid contained in the electrolyte solution, ammonium adipate of an equal weight was used. The film thickness and refractive index of the titanium oxide layer were determined in the same manner as in Example 1. The results are shown in Table 2. In addition, a capacitor was formed in the same manner as in Example 1 using a substrate on which a titanium oxide layer had been formed, and the capacitor characteristics indicated in Table 2 were examined in the same manner as in Example 1. The results are shown in Table 2.

Example 15

A titanium oxide layer was formed in the same manner as in Example 1 with the exception that, instead of phosphoric acid contained in the electrolyte solution, sulfuric acid of an equal weight was used. The film thickness and refractive index of the titanium oxide layer were determined in the same manner as in Example 1. The results are shown in Table 2. In addition, a capacitor was formed in the same manner as in Example 1 using a substrate on which a titanium oxide layer had been formed, and the capacitor characteristics indicated in Table 2 were examined in the same manner as in Example 1. The results are shown in Table 2.

Examples 16 to 18

A titanium oxide layer was formed in the same manner as in Example 1 with the exception that the current density was changed to a current density indicated in Table 1. It should be noted that because a voltage of 60 V was not achieved with the current density of Example 16 within the same duration as that of Example 1, the duration of anodic oxidation process in Example 16 was adjusted to 60 minutes. Apart from the above modification, a titanium oxide layer was formed and the film thickness and refractive index of the titanium oxide layer were determined in the same manner as in Example 1. The results are shown in Table 2. In addition, a capacitor was formed in the same manner as in Example 1 using a substrate on which a titanium oxide layer had been formed, and the capacitor characteristics indicated in Table 2 were examined in the same manner as in Example 1. The results are shown in Table 2.

Comparative Example 5

A platinum foil having a size of 15 mm×15 mm and having a thickness of 50 μm was prepared as a substrate, and the substrate and a sputtering target were placed inside the chamber of the sputtering apparatus so that the distance between the substrate and the sputtering target was 50 mm. The Model SPF-332H (manufactured by Nichiden Anelva Corporation) was used as the sputtering apparatus. Further, titanium dioxide having a rutile crystal structure with a diameter of 76 mm and a thickness of 5 mm was used as the sputtering target.

The pressure inside the chamber was then reduced without heating the substrate until a pressure of $2 \times 10^{-4}$ Pa was achieved. Subsequently, after introducing oxygen until the pressure inside the chamber reached a pressure of $1 \times 10^{-2}$ Pa, argon was introduced until the pressure inside the chamber reached a pressure of $2 \times 10^{-1}$ Pa. Thereafter, a radio frequency (RF) power was set to 200 W, and a titanium dioxide film having a thickness indicated in Table 2 was formed on top of the substrate by sputtering the sputtering target.

The substrate on which a titanium dioxide film had been formed was then taken out of the chamber, and the refractive index of the titanium dioxide film was measured in the same manner as in Example 1. The results are shown in Table 2.

In addition, a capacitor was formed in the same manner as in Example 1 using a substrate on which a titanium oxide layer had been formed with the exception that the thickness of copper deposition was changed to 200 nm, and the capacitor characteristics indicated in Table 2 were examined in the same manner as in Example 1. The results are shown in Table 2.

From the results shown in Table 2, it was possible to confirm that the refractive index of the titanium oxide layer in Examples 1 to 20 at a wavelength of 632.8 nm was within a range from 1.90 to 2.35, and that the titanium oxide constituting the titanium oxide layer was amorphous. In addition, in Examples 1 to 20, the relative dielectric constant of the titanium oxide layer was within a range from 30 to 50, and the product of capacitance density and dielectric breakdown voltage at a measuring frequency of 1 kHz was 200 nF·V/cm$^2$ or more.

Moreover, the ratio (C(1 MHz)/C(100 Hz)) was 80% or more in Examples 1 to 20, showing a low level of frequency dependency.

Furthermore, in Examples 1 to 18 in which the concentration of hydrogen peroxide in the electrolyte solution was within a range from 0.1 to 40% by mass, a capacitor 10 exhibiting a dielectric loss tangent (tan δ), at a measuring frequency of 1 kHz, of 0.01 or less was obtained.

On the other hand, in Comparative Examples 1 to 5, since the temperature of the electrolyte solution was higher than 3° C., the refractive index of the titanium oxide layer at a wavelength of 632.8 nm exceeded 2.35.

INDUSTRIAL APPLICABILITY

The present invention can be applied to a method for producing a capacitor, a capacitor, and a wiring board, electronic device and IC card which include the capacitor, and can be applied particularly to a method for producing a capacitor which is capable of producing a capacitor having a high withstand voltage and low leakage current.

The invention claimed is:

1. A method for producing a capacitor having a substrate serving as one electrode, a dielectric layer formed on top of the substrate, and the other electrode formed on top of the dielectric layer, the method comprising:
a step for forming an amorphous titanium oxide layer which is to become the dielectric layer on top of the substrate by anodizing the substrate, which is composed of titanium or titanium alloy, in an electrolyte solution containing hydrogen peroxide and having a temperature of 3° C. or less; and
a step for forming the other electrode on top of the dielectric layer.

2. The method for producing a capacitor according to claim 1,
wherein a concentration of the hydrogen peroxide in the electrolyte solution is from at least 0.1% by mass up to less than 50% by mass.

3. The method for producing a capacitor according to claim 1, wherein the electrolyte solution is an aqueous phosphoric acid solution.

4. The method for producing a capacitor according to claim 1, wherein the titanium alloy is an alloy containing 70% by mass or more of titanium.

5. The method for producing a capacitor according to claim 1, wherein the substrate is a foil.

6. The method for producing a capacitor according to claim 5, wherein a thickness of the foil is within a range from 5 to 300 μm.

7. The method for producing a capacitor according to claim 1, wherein the other electrode is composed of a metal.

8. The method for producing a capacitor according to claim 1, further comprising a step for laminating a titanium oxide layer and an insulating material layer.

* * * * *